(12) United States Patent
Schoenborn

(10) Patent No.: US 6,909,174 B2
(45) Date of Patent: *Jun. 21, 2005

(54) REFERENCE PLANE OF INTEGRATED CIRCUIT PACKAGES

(75) Inventor: Theodore Zale Schoenborn, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 223 days.

This patent is subject to a terminal disclaimer.

(21) Appl. No.: 10/177,806

(22) Filed: Jun. 21, 2002

(65) Prior Publication Data

US 2002/0176239 A1 Nov. 28, 2002

Related U.S. Application Data

(62) Division of application No. 09/727,988, filed on Nov. 30, 2000, now Pat. No. 6,580,619.

(51) Int. Cl.[7] .............................................. H01L 23/52
(52) U.S. Cl. ....................... 257/691; 257/692; 257/774; 257/773
(58) Field of Search ................................ 257/691–692, 257/773–774

(56) References Cited

U.S. PATENT DOCUMENTS

| | | |
|---|---|---|
| 5,557,502 A | 9/1996 | Banerjee et al. |
| 5,578,940 A | 11/1996 | Dillon et al. |
| 5,809,263 A | 9/1998 | Farmwald et al. |
| 5,841,715 A | 11/1998 | Farmwald et al. |
| 6,064,116 A | 5/2000 | Akram |
| 6,016,472 A | 11/2000 | Ali |
| 6,255,852 B1 | 7/2001 | Forbes et al. |
| 6,295,220 B1 | 9/2001 | Darwish et al. |
| 6,359,234 B1 | 3/2002 | Kouda |
| 6,414,396 B1 | 7/2002 | Shim et al. |
| 6,532,162 B2 * | 3/2003 | Schoenborn ................. 365/51 |

OTHER PUBLICATIONS

Direct Rambus™ RIMM™ Module Design Guide, Version 0.9, Jul. 1999.

* cited by examiner

Primary Examiner—Luan Thai
(74) Attorney, Agent, or Firm—Blakely, Sokoloff, Taylor & Zafman LLP

(57) ABSTRACT

An apparatus including an integrated circuit including a plurality of devices and signal circuitry coupled to the plurality of devices, and a package substrate including a first surface coupled to the integrated circuit, a second surface having a plurality of externally accessible contact points coupled to the signal circuitry, and a continuous layer of conductive material coupled to a reference signal of the integrated circuit and disposed over an area of the second surface and electrically isolated from the contact points.

16 Claims, 4 Drawing Sheets

US 6,909,174 B2

REFERENCE PLANE OF INTEGRATED CIRCUIT PACKAGES

RELATED APPLICATION

This application is a divisional of U.S. patent application, Ser. No. 09/727,988, filed Nov. 30, 2000, which issued as U.S. Pat. No. 6,580,619 on Jun. 27, 2003. Also, this application is similar to U.S. patent application Ser. No. 09/728,837, filed Nov. 30, 2000, which issued as U.S. Pat. No. 6,532,162 on Mar. 11, 2003 and U.S. patent application Ser. No. 09/727,989, filed Nov. 30, 2003, which issued as U.S. Pat. No. 6,628,528 on Sep. 30, 2003.

BACKGROUND OF THE INVENTION

1. Field of the Invention

The invention relates to packaging technology and more particularly packaging technology in the context of improving integrated circuit device performance.

2. Background

Computer systems typically include modules that communicate with a processor using a bus. One example of such a module is a memory module containing one or more integrated circuit memories. The bus is basically a transmission line that carries signals such as clock, time, data, control, and address signals between the processor, modules, and other bus devices. A popular type of integrated circuit memory is dynamic random access memory (DRAM). A typical configuration involves coupling a plurality of integrated circuit memories each comprising for example, 64 megabyte (Mb)/72 Mb, 128 Mb/144 Mb to 256 Mb and 352 Mb DRAM circuits on a memory module. The memory module is suitable for connection to a printed circuit board (PCB) such as a mother board containing an application specific integrated circuit (ASIC). In this context, a memory module may be suitable for use in a broad range of applications, including, but not limited to, computer memory, personal computers, and work stations.

The RIMM™ memory module designed by Rambus Inc. of Mountain View, Calif. consists of 128 Mb/144 Mb DRAM dies organized as eight (8) Mega words by 16 or 18 bits. Such technology permits 600 Megahertz (MHz), 711 MHz, or 800 MHz transfer rates using conventional system and board design technologies. The modules are capable of sustained data transfers at 1.25 nanoseconds (ns) per two (2) bytes. The individual DRAM dies (RDRAM™ dies) are arranged in packages on the module and, in the case of multiple DRAM die packages, serially connected to an adjacent package.

Packaging technology of memory devices (e.g., DRAM memory devices) is typically described as one tape layer packaging. In a general sense, an integrated circuit contains a plurality of bond pads to address the various devices on the circuit (e.g., the various DRAM cells). Through packaging technology, the individual bond pads of an integrated circuit are coupled to corresponding bond pads, typically having a greater pitch, on a package. The bond pad pitch is then suitable for coupling to the module. The package thus acts as a transformer between the mechanical pitch of the integrated circuit and the mechanical pitch of the module. The package generally utilizes a single metal layer to transform the routing pitch between the die and package so that the pitch of the package corresponds to the module. The single metal layer routes to contact structures on the surface of the package, such as ball grid arrays (BGAs), suitable for coupling to the module. Bonding configurations between the integrated circuit and the module are typically classified as center-bonded where the die connections are in the center of the die and edge-bonded connections where the die connections are on the edge of the die.

Memory module manufacturers or designers may use the electrical parameters of the package (e.g., the parasitics of the package including the integrated circuit chip or die) as part of the electrical design of the module. Performance evaluations of such designs are used to characterize and classify the capabilities (e.g., frequency capabilities) of the module. As the signal frequency is continually increased to speeds of 800 megatransfer or greater, the contribution of the package parasitics plays a larger role. For example, for a given transmission line, DRAM packages have a resistance, an inductance, and a capacitance. In performance simulations, these electrical parameters are generally considered ideal. However, factors such as the capacitance of a package trace attributable to die activity or signal patterns and trace to trace coupling can be significant in, for example, effecting the impedance and propagation velocity of a signal. Impedance to propagation velocity impact the timing margin of the signal as well as the voltage margin. Similarly, the inductance, due to, for example, inductive package trace coupling, may affect signal integrity, particularly affecting voltage margins. Thus, what is needed is an improved package and module configuration that minimizes die and package parasitics.

BRIEF DESCRIPTION OF THE DRAWINGS

The features, aspects, and advantages of the invention will become more thoroughly apparent from the following detailed description, appended claims, and accompanying drawings in which:

DETAILED DESCRIPTION OF THE INVENTION

Figure 1:
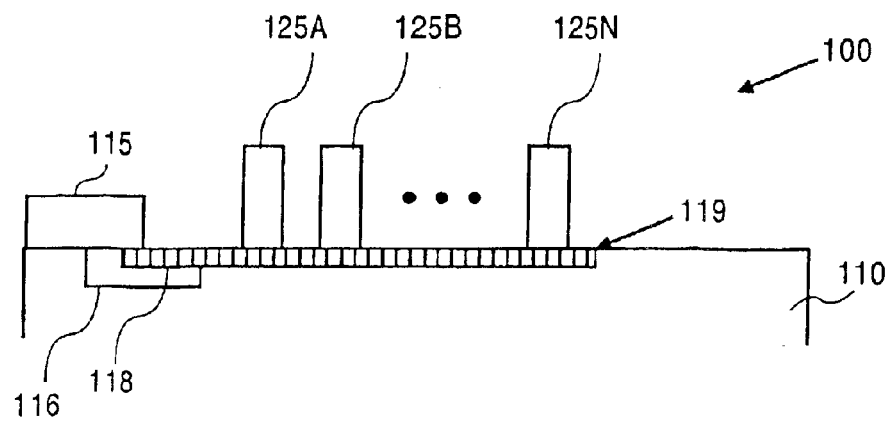
FIG. 1 shows a cross-sectional view of a plurality of modules coupled to a printed circuit board in accordance with an embodiment of the invention.

An apparatus is disclosed. In the following paragraphs, a detailed description of an apparatus of a die and package substrate and a memory module is presented. The presentation is in the context of a memory package, particularly a DRAM die package. It is to be appreciated, that the apparatus described is not limited to DRAM memory or memory devices generally but may find broader application in packaging technologies of other devices.

In one embodiment, the apparatus includes an integrated circuit comprising a plurality of memory devices and signal circuitry coupled to the plurality of memory devices. A package substrate is coupled to the integrated circuit. The package substrate includes a first surface and a second surface. The second surface has a plurality of contact points coupled to the signal circuitry. The package substrate also includes an externally accessible reference signal line, including for example, a ground or power plane, disposed between the integrated circuit and the second surface.

In another embodiment, the apparatus includes a memory module comprising at least one memory package configured for electrically coupling to a bus on a system board. The at least one memory package includes an integrated circuit comprising a plurality of memory devices and a package substrate coupled to the integrated circuit. A surface of the package substrate includes a plurality of externally accessible contact points coupled to signaling circuitry of the integrated circuit and to the memory module. A reference signal line, including, for example, a ground or power plane, is disposed between the integrated circuit and the second surface.

In still another embodiment, the apparatus includes an integrated circuit comprising a plurality of devices (e.g., memory or other devices) and a package comprising a first surface coupled to the integrated circuit, a second surface having a plurality of externally accessible contact points coupled to the signal circuitry. The package also includes a continuous layer of conductive material coupled to a reference signal of the integrated circuit and disposed over an area of the second surface and electrically isolated from the contact points. An apparatus including a module and having at least one package comprising an integrated circuit and a package substrate having a continuous layer of conductive material, coupled to a reference signal of the integrated circuit, disposed over an area of a surface of the package is yet another embodiment.

A method is also disclosed. In one embodiment, the method includes routing a signal from a memory device on an integrated circuit in a package to a memory module, and returning the signal to a reference line (e.g., reference plane) in the package between the memory module and the integrated circuit. In another embodiment, the method includes tuning the electrical characteristics of a memory package using an electrical potential between contact points on the package and a reference signal line in the package.

Figure 2:
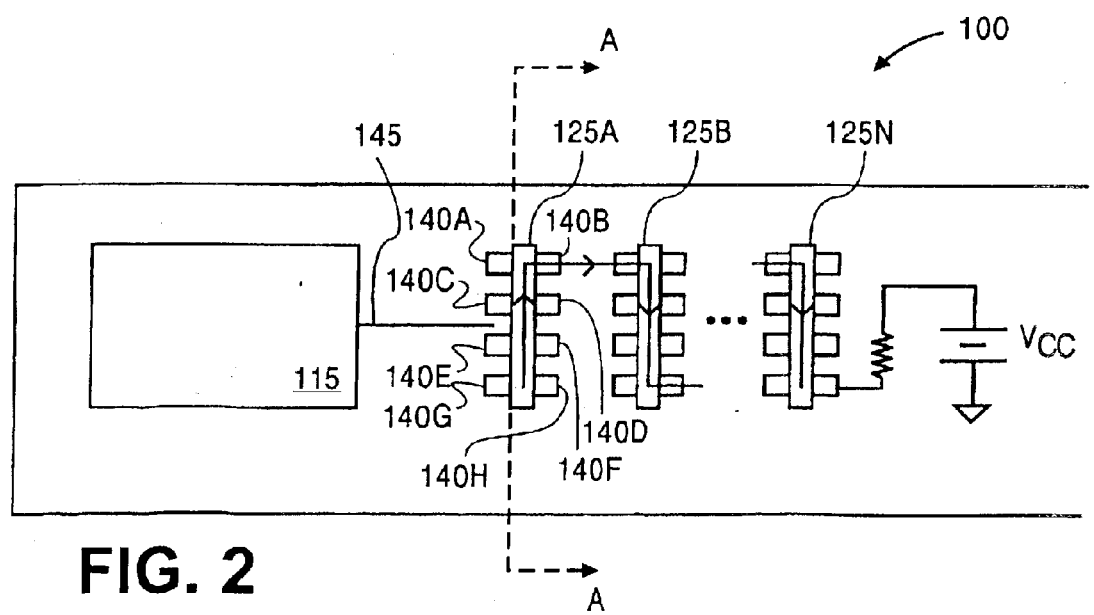
FIG. 2 shows a schematic top view of the structure of FIG. 1.

FIG. 1 illustrates a schematic cross-sectional side view of a topology for a single-channel bus on a motherboard. FIG. 2 illustrates a schematic top view of the system of FIG. 1. Specifically, System 100 includes printed circuit board 110 such as a motherboard having master application specific integrated circuit (ASIC) 115 coupled thereto. ASIC 115 is, in one embodiment, a memory controller or memory controller hub (MCH). In other embodiments, ASIC 115 might be a direct memory access (DMA) controller, a graphics controller, a microprocessor, or some other type of intelligent controller. ASIC 115 is electrically coupled to bus 119 through signal lines 116 and 118 for, for example, clock, data, address, and control signals. Coupled to bus 119 of PCB 110 are a plurality of modules 125A, 125B, . . . , 125N coupled via a PCB socket connection. In one embodiment, modules 125A, 125B, . . . , 125N are memory modules having memory slaves, referring to module 125A, memory slaves 140A, 140B, 140C, 140D, 140E, 140F, 140G, and 140H, that represent DRAM die packages, specifically RDRAM™ packages designed by Rambus, Inc. of Mountain View, Calif. According to current technology, each memory module can be designed for one to 16 RDRAM™ devices. Alternatively, slaves 140A, 140B, . . . 140G may include other types of memory such as other types of DRAMS, static RAMs (SRAMs), video RAMs (VRAMs), or electrically programmable read-only memories (EPROMs).

It is appreciated that FIGS. 1 and 2 illustrates only those features necessary for an understanding of the invention. A person of skill in the art will understand the general layout, coupling, and functioning of a module such as a memory module to a bus on a PCB such as a motherboard. Accordingly, specific detail regarding, for example, signal routing or power, ground, clock and signal routing, is not presented in order not to obscure the invention.

Referring to FIG. 2, module 125A is a memory module, such as a RIMM™. In the case of a RIMM™ using RDRAM™ devices, signals, such as data signals, are transmitted from ASIC 115 along transmission line 145 to module 125A and its memory devices to module 125B and so on to module 125N in a serial fashion.

Figure 3:
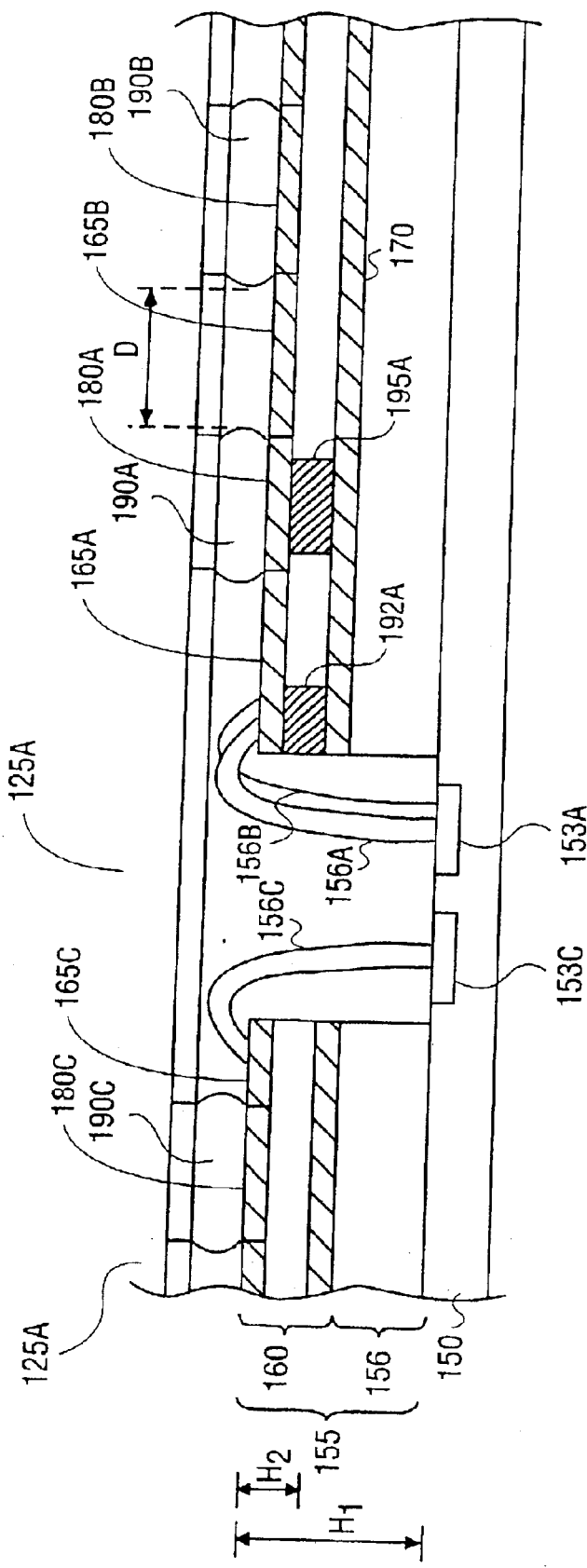
FIG. 3 shows a schematic cross-sectional view of a DRAM die coupled to a memory module in accordance with an embodiment of the invention.

FIG. 3 illustrates a cross-section schematic view through line A–A' of FIG. 2, specifically illustrating the coupling of RDRAM™ package 140A to memory module 125A. Referring to FIG. 3, there is shown die 150 comprising, for example, an integrated circuit that is for example a 128 Mb/144 Mb RDRAM™ circuit. On one side of die 150 are centrally-aligned contacts, for electrically coupling die 150 to a package through wire bonds 156A and 156C. It is to be appreciated that centrally-aligned contact packaging is one choice. RDRAM™ packaging also supports edge-aligned contacts, and the aspects of the invention presented herein are equally applicable to such packaging. FIG. 3 is representative of micro-BGA ($\mu$BGA) packaging. It is also to be appreciated that $\mu$BGA packaging represents one choice and that there are other types of packaging such as flip-chip bonding to a variety of substrate materials (e.g., ceramic, organic, etc.) for which the invention finds application.

Referring to FIG. 3, package 155 includes elastomeric layer 156 and tape layer 160. One surface of tape layer 160, in this embodiment, the surface adjacent integrated circuit 150, includes reference plane 170. In one embodiment, reference plane 170 is a ground plane in that, reference plane 170 includes a metal layer or signal line, coupled to ground. There may be one or multiple reference planes in package 155 depending on the application for such planes. The opposite surface of tape 160 includes conductive traces 165A, 165B, and 165C coupling contact pads 180A, 180B, and 180C, respectively to bond pads 153A, 153B, and 153C of die 150 through, in this example, wire bonds 156A, 156B, and 156C, respectively. Conductive traces 165A, 165B, and 165C are each one of, for example, power, ground, and signal traces. Techniques for forming a tape layer having signal traces on one side are known to those of skill in the art. Similar techniques may be used to locate a conductive reference plane (e.g., copper alloy) on the opposite surface of tape layer 160 (e.g., two sided tape).

Overlying externally accessible contact points 180A, 180B, and 180C of package 155 are contacts 190A, 190B, and 190C, such as solder balls of a BGA that are used to couple the package to module 125A.

Figure 4:
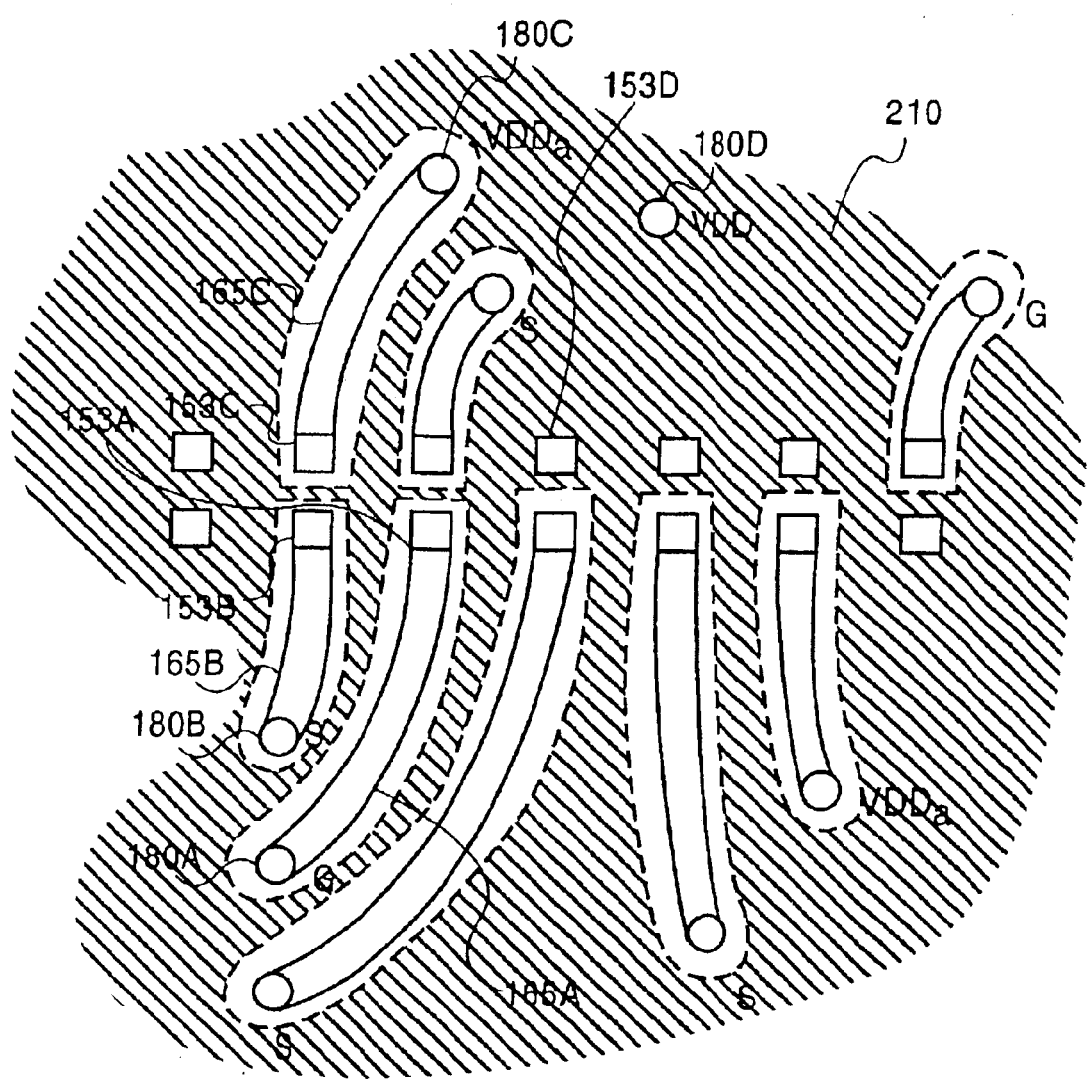
FIG. 4 shows a schematic top view of a memory package in accordance with an embodiment of the invention.

FIG. 4 illustrates a top view of the surface of package 140A. In this example, package 140A is a center bonded package where die connection 153A and 153B are in the center of the die. FIG. 4 shows representative ground traces, e.g., trace 165A, signal traces, e.g., trace 165B, and representative $V_{DD}$-analog ($V_{DDa}$) traces, e.g., trace 165C, linking die connections to contact pads, e.g., contact pads 180A, 180B, and 180C, respectively.

In the embodiment shown in FIG. 3 and FIG. 4, die connection 153A corresponds to a ground. Wire bond 156A connects die connection 153A to conductive trace 165A which routes to contact point 180A for mounting to memory module 125A. Conductive vias 192A and 195A couple conductive trace 165A and contact point 180A to ground.

Techniques as known to those of skill in the art may be used to pattern and form conductive vias 192A and 195A to reference plane 170. Such techniques include, where necessary, the use of antipads adjacent a power or signal line to avoid grounding such lines. By coupling conductive trace 165A to reference plane 170 (e.g., at a point on the package adjacent die connection 153A) and contact point 180A to reference plane 170, conductive trace 165A is essentially shielded and the ground signal loop inductance is reduced with a smaller loop area.

In the case of reference plane 170 coupled to a ground, by routing along a conductive trace (e.g., conductive trace 165A) and coupling the trace and contact point to ground, the embodiment makes use of current routing schemes designed by, for example, memory module and DRAM package designers. In the case of a RIMM™ memory module, such designers generally contemplate a conductive trace for ground connections. In the absence of such constraints, however, in another embodiment, the conductive trace (e.g., conductive trace 165A) may be eliminated and contact point 180A may be coupled to reference plane 170 by way of a direct via to reference plane 170.

In another aspect of the embodiment illustrated in FIG. 4, a conductive material (e.g., copper or aluminum alloy) is selectively introduced over the surface of package 140A (the surface having the conductive traces for coupling to a module). The selective introduction creates a mass, or flood 210. In one embodiment, flood 210 is continuous (e.g., no islands) and is coupled between power (e.g., $V_{DD}$) contacts on package 140A and die 150. Referring to FIG. 4, $V_{DD}$ contact 153D is coupled (e.g., through a wire bond) to flood 210 and $V_{DD}$ contact 180D is coupled to flood 210. In this manner, flood 210 approximates a high frequency capacitor which tends to lower the package inductance by effectively decreasing the loop area for power delivery between die 150 and package 140A.

Flood 210 may be a metal tape layer appropriately etched to form openings about conductive routing traces (e.g., conductive trace 165A, 165B, 165C, etc.) to prevent shorting. Flood 210 may be coupled between power contacts on package 140A and die 150 using conductive vias.

Figure 5:
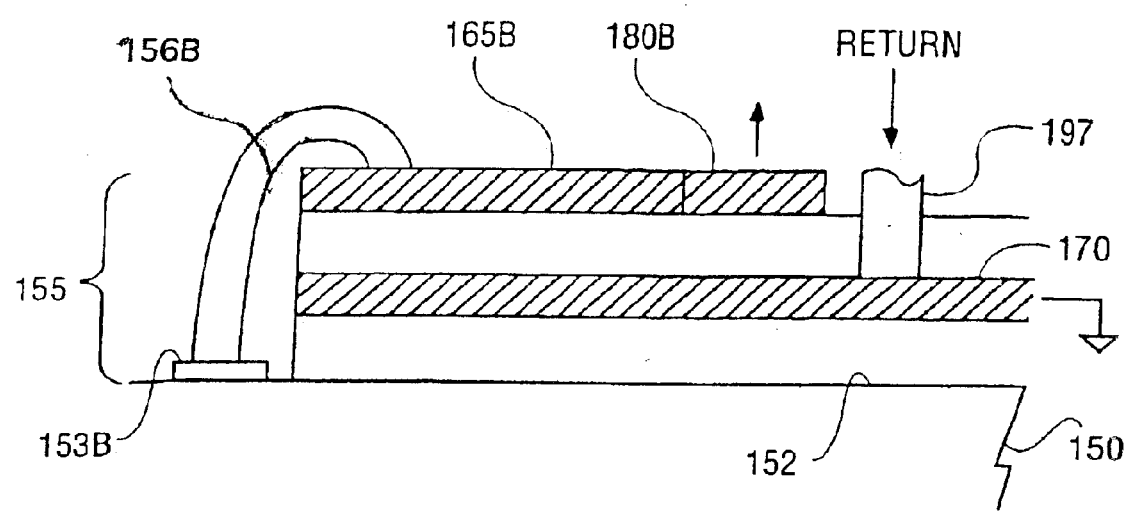
FIG. 5 shows a cross-sectional view of a portion of a memory module with connections to a signal trace and a ground plane in accordance with an embodiment of the invention.

FIG. 5 shows another cross-section of package 140A showing representative signal connections from die 150 to module 125A. In one example, a signal propagated from die 150 is transmitted by wire bond 156B to die connection 153B, to trace 165B, to contact point 180B and to module 125A. A return signal, in this embodiment, travels from memory module 125A through conductive via 197 to reference plane 170 to ground. In a further embodiment, two signals may share the return path to reduce the number of contact points on module 125A and package 155. Such path sharing is employed in prior art memory modules, including the RIMM™ module and can be implemented in the context of this invention.

The addition of a reference plane 170 (e.g., ground plane) in a package such as DRAM die package 155 improves signal impedance, reduces trace-to-trace coupling, and reduces the inductance between signals. Each of these improvements is described in detail in the following paragraphs.

Reduction in Signal Capacitance

As noted above, for a given transmission line or package trace, DRAM devices have a resistance, an inductance, and a shunt capacitance. Mathematically, an impedance through a transmission line where DRAM devices load the line (e.g., an RDRAM channel as shown in FIGS. 3 and 4) may be represented as follows:

$$Z_0 = \sqrt{\frac{L_{Moduletrace}}{C_{Moduletrace} + C_{pkg}}} \quad (1)$$

In Equation 1, $L_{Moduletrace}$ refers to the inductance of a routed trace on the module; $C_{Moduletrace}$ refers to the capacitance of a trace routed on the module; and $C_{pkg}$ refers to the capacitance of a trace routed on the package and, to some extent, the capacitance from the DRAM die.

Signal velocity through the referenced section of the transmission line is also dependent on the capacitance of the package. In mathematical terms:

$$V = \frac{1}{\sqrt{L_{Moduletrace} \cdot (C_{Moduletrace} + C_{pkg})}} \quad (2)$$

In designing high-performance DRAM modules, designers recognize the significance of the package capacitance. The capacitance of the package is significant enough that in general the capacitance drives the impedance down. Specifically, it is desirous to keep the capacitance constant from package trace to package trace so that signal velocities through a module channel will be consistent. Similarly, the trace-to-trace impedance should also be constant so that any reflections in the channel are similar and signal integrity is maintained as signals proceed through the module channel. One standard in RDRAM™ memory module design is that the capacitance of the package, considering both the capacitance attributable to a trace and the die, is within 60 femptoFarads (fF) from trace to trace.

In simulating memory modules, module designers measure the capacitance of the traces of a package and tune the capacitance of the module so that the package capacitance between traces is within 60 fF. In order to do this, the designers reference the DRAM die surface as ground and calculate the capacitance of a trace relative to the die surface. The capacitance results from different voltage potentials between the trace and the die when the die is in a generally static state. Therefore, the package capacitance is tuned to be within the required capacitance variation when the die is static or idle.

Designating the die surface as a ground for the purpose of calculating and tuning the capacitance of a die package does not take into account that the potential at the die surface may not look like ground over time with an active die. Instead, it is typically more likely that there are and will be localized potential fields within the die caused by, for example, circuit switching and addressing of one of typically as many as six (6) interconnect layers within the die. In some instances, the surface of the die for potential purposes may look more like power than ground, resulting in a much lower capacitance. In short, when a die is active there is a strong likelihood of the potential wandering with the activity within the die. Accordingly, a capacitance tuned to a static die to be within 60 fF, for example, likely will not be within this range for an active die.

Potential wandering with die activity and thus, the package capacitance dynamically changing with activity within the die and signal patterns effects the timing margin of signals. In a memory module using source synchronous timing, a clock (e.g., a differential clock) is routed together with a data signal. Typically, it is desired that the clock signal and the data signal match. It is also desirous that the setup and hold of the data signal is maximized typically by sending the clock edge at the center of a data signal so that the correct logic values are seen before the clock edge. Such is the case, for example, when driving a WRITE to a DRAM device.

As described above, the capacitance of the package affects the signal velocity. Thus, a dynamically changing package capacitance can affect the timing margin, for example, minimizing setup and hold, or, in the worst case, clocking to the wrong data value.

As noted above, the package capacitance also affects the signal impedance. Such impedance affects the voltage margin between a reference voltage and the actual signal voltage. Thus, a dynamically changing capacitance can affect the impedance such that resolutions at a signal receiver between a reference voltage and a signal are interpreted incorrectly. For example, a reference voltage comparison might register a "0" for a "1" because the voltage signal was too weak.

As demonstrated above, the capacitance of the package contributes significantly to the timing margin and the voltage margin. Such contribution is not always accurately reflected when the surface of a package is used as a reference ground. According to an aspect of the invention, however, the package is provided with a ground plane (reference plane 170 in FIG. 3) that allows a true ground to be established as a potential reference. In this manner, the capacitance of the package may be tuned for a desired margin such as 60 fF, to improve the performance of the memory module. In other words, the impedance and velocity of signals through a module channel can approach similarity and the timing margins and voltage margins may be improved because die activity and wandering potential issues are reduced by referencing a ground plane rather than the die surface or ground.

Trace-to-Trace Capacitance

In addition to the capacitance between a package trace and a die, there is also generally some trace-to-trace capacitance that will affect timing and voltage margins. Trace-to-trace capacitance relates to cross-coupling of traces seen where adjacent traces are switching. This is often referred to as even and odd mode coupling, with even mode referring to devices of a trace switching together (constant capacitance) and odd mode to devices of adjacent traces switching opposite one another (maximized capacitance). In general, in prior art simulations, cross-coupling of package traces is ignored as contributing to package capacitance. However, as described above, in an active device, cross-coupling capacitance can be significant. Therefore, in another aspect of the invention, the cross-coupling capacitance is reduced.

Referring to FIG. 3, the trace-to-trace capacitance is that capacitance measured between bond pad 180A and bond pad 180B, represented as the capacitance across distance D. Experimental studies of current technology packages indicate that increasing the spacing between contact points 180A and 180B (i.e., increasing spacing between traces) minimizes the cross-coupling capacitance. Ideally, the distance D should be three times the height between a trace and a non-ideal reference plane such as the die surface. However, as design rules advance, the spacing limits are continually pushed to smaller and smaller device pitches. Thus, designers are limited by their ability to adequately space traces to avoid cross-coupling. It is to be appreciated that it is generally left to the designers to determine how much cross-coupling the design can tolerate.

One way to reduce the significance of coupling is by adding a reference plane, such as a ground plane, to the die package. Referring to FIG. 3, where a non-ideal reference plane is the surface of the die, a distance between the trace and the non-ideal reference plane, H, is much greater than the distance between the same trace and package reference plane 170, $H_2$. Thus, an ideal spacing between traces, D, of three times the distance between the trace and the reference plane may be achieved with tighter pitch constraints where a reference plane is added in the package (e.g., reference plane 170). Adding a reference plane allows the capacitance between the trace and the reference plane to dominate the cross-coupling capacitance.

Additive Effect of a Varying Capacitance between Multiple DRAM Dies

In addition to the capacitance issues related to individual DRAM devices, notably the package capacitance as discussed above, cumulative velocity and impedance variations due to a fluctuating capacitance as signals travel from device to device. As noted above, in the RIMM™ technology, the individual DRAM die packages are arranged serially on the memory module. Referring to FIG. 2, a signal, typically many signals, e.g., 16–18 data signals, are transmitted from ASIC 140 (e.g., MCH) to module 125A to module 125B and so on to module 125N. Accordingly, data desired to be written or read in a DRAM die in module 125N proceeds through the preceding DRAM dies in a serial transmission. Impedance fluctuations between the various DRAM die packages can create signal reflections when the impedance encountered from one die package differs from the impedance encountered with a subsequent die package. In other words, impedance discontinuities on the device-to-device transmission lines will generate reflections. Ideally, if the transmission line impedance is matched throughout the module, there will be no reflections. However, when the impedances are not matched, the resulting reflections tend to degrade system performance. Thus, impedance mismatches lead to increased voltage margins and a downgrading of system performance. The capacitance of each die package, as explained above, plays an important role in matching package die impedance. Thus, the addition of a reference plane on the package improves impedance matching between package dies on memory module 120. It is to be appreciated that velocity is being effected in a similar fashion as can be seen by reference to Equation (2). Impedance and velocity mismatches as described above can be encountered on a line to line basis thus further compromising timing and voltage margins for source synchronous signaling such as in the RIMM™ technology.

Odd and Even Mode Inductance

Referring again to FIG. 2, as well as FIG. 4, as signals (e.g., data signals) propagate along transmission lines through the individual modules of DRAM die packages, for example in driving a READ at a selected DRAM die package, a signal forms an inductance loop with a ground at the die. According to current technology, particularly with a RIMM™ memory module, two signal lines share a transmission line loop to ground. Thus, a ground trace brings the signal current from two signal lines back to ground (e.g., current shares a return path). Such current path sharing results in inductive coupling. Inductive coupling creates even and odd mode inductance depending upon the shared signal. Such inductive coupling degrades the driven signal integrity as it couples noise, particularly on analog signals, such as $V_{ref}$ and analog power and ground signals. Ideally, separate field lines (e.g., separate ground lines) are desired but manufacturing issues such as the addition of more contact points preclude such configuration. By adding a ground plane to a die package, the reference loop is made smaller resulting in a reduced inductance (e.g., reduced inductive coupling) and improved signal integrity.

Reduction of Ground Bounce

With prior art current source DRAM devices, including RDRAM™ devices designed by Rambus, Inc. having memory devices accessed by transistors, one objective is to operate the transistor at saturation from address start to finish. Thus, the transistor device is designed to look like a current source at saturation the entire time an individual DRAM device is addressed to avoid signal integrity problems. However, whenever a transistor device is turned on or off, immediately after (in the case of an on) or immediately before (in the case of an off), a weak signal may be driven that could cause the transistor to fall out of saturation. The weak signal can be attributed to the relative potential between the device and a signal ground. This problem is amplified in the case of modules where signals share a single ground as discussed above.

According to an aspect of the invention, a reference plane such as a ground plane is added in the package. Thus, the ground plane is localized which reduces the ground (loop) inductance to provide improved isolation of the individual devices. The improved isolation reduces the ground bounce attributable to device sharing of a ground.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. An apparatus comprising:
a package substrate comprising a first surface coupled to an integrated circuit having signal circuitry, a second surface having a plurality of externally accessible contact points coupled to the signal circuitry, and a continuous layer of conductive material coupled to a reference signal of the integrated circuit and disposed over an area of the second surface and electrically isolated from the contact points.

2. The apparatus of claim 1, wherein the reference signal is a power signal.

3. The apparatus of claim 1, further comprising conductive traces coupled to the contact points comprising a dimension extending over the second surface of the package substrate.

4. The apparatus of claim 1, further comprising an externally accessible reference signal line disposed between the integrated circuit and the second surface.

5. An apparatus comprising:
a module comprising at least one package configured for electrically coupling to a bus on a system board, the at least one package comprising:
a package substrate comprising a first surface coupled to an integrated circuit having signal circuitry, a second surface having a plurality of externally accessible contact points coupled to the signal circuitry and the module, and a continuous layer of conductive material coupled to a reference signal of the integrated circuit and disposed over an area of the second surface and electrically isolated from the contact points.

6. The apparatus of claim 5, wherein the reference signal is a power signal.

7. The apparatus of claim 5, further comprising conductive traces coupled to the contact points comprising a dimension extending over the second surface of the package substrate.

8. The apparatus of claim 6, wherein the module comprises a plurality of memory packages arranged in a serially addressable configuration.

9. The apparatus of claim 5, wherein the package further comprises an externally accessible reference signal line disposed between the integrated circuit and the second surface.

10. An apparatus comprising:
a module comprising at least one package electrically coupled to and addressable through a control circuit of a system board, the at least one package comprising:
an integrated circuit comprising a plurality of devices; and
a package substrate comprising a surface having a plurality of externally accessible contact points coupled to the devices and the module, and a continuous layer of conductive material coupled to a reference signal of the integrated circuit and disposed over an area of the surface and electrically isolated from the contact points.

11. The apparatus of claim 10, wherein the reference signal is a power signal.

12. The apparatus of claim 10, further comprising conductive traces coupled to the contact points comprising a dimension extending over the surface of the package substrate.

13. The apparatus of claim 10, the plurality of devices of the integrated circuit comprise a plurality of memory devices.

14. The apparatus of claim 13, wherein the module comprises a plurality of memory packages arranged in a serially addressable configuration.

15. The apparatus of claim 10, wherein the package further comprises an externally accessible reference signal line disposed between the integrated circuit and the second surface.

16. The apparatus of claim 15, wherein the reference signal line is coupled to a ground.

* * * * *